_(12)_ United States Patent
Maejima et al.

(10) Patent No.: US 7,907,436 B2
(45) Date of Patent: Mar. 15, 2011

(54) NONVOLATILE SEMICONDUCTOR STORAGE DEVICE AND DATA WRITING METHOD THEREFOR

(75) Inventors: Hiroshi Maejima, Chigasaki (JP); Katsuaki Isobe, Yokohama (JP); Hideo Mukai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 12/370,111

(22) Filed: Feb. 12, 2009

(65) Prior Publication Data
US 2009/0207647 A1    Aug. 20, 2009

(30) Foreign Application Priority Data
Feb. 14, 2008   (JP) ................... 2008-032646

(51) Int. Cl.
*G11C 11/00*    (2006.01)
(52) U.S. Cl. ... 365/148; 365/163; 365/175; 365/189.08; 365/189.16
(58) Field of Classification Search ............. 365/148, 365/163, 175, 189.08, 189.16
See application file for complete search history.

(56) References Cited

U.S. PATENT DOCUMENTS

| 7,307,268 B2 * | 12/2007 | Scheuerlein ............ 257/2 |
| 7,800,935 B2 | 9/2010 | Maejima et al. |
| 2005/0146955 A1 * | 7/2005 | Kajiyama ............. 365/202 |
| 2008/0175032 A1 * | 7/2008 | Tanaka et al. ........... 365/51 |
| 2010/0027308 A1 | 2/2010 | Maejima |
| 2010/0027317 A1 | 2/2010 | Maejima |
| 2010/0054017 A1 | 3/2010 | Maejima |
| 2010/0097832 A1 | 4/2010 | Mukai et al. |
| 2010/0103714 A1 | 4/2010 | Maejima |

* cited by examiner

*Primary Examiner* — Tuan T Nguyen
*Assistant Examiner* — Toan Le
(74) *Attorney, Agent, or Firm* — Oblon, Spivak, McClelland, Maier & Neustadt, L.L.P.

(57) ABSTRACT

A nonvolatile semiconductor storage device includes: a first wire and a second wire intersecting each other; a memory cell which is disposed at each intersection of the first wire and the second wire and electrically rewritable and in which a variable resistor for memorizing a resistance value as data in a nonvolatile manner and a rectifying device are connected in series; and a control circuit which applies a voltage necessary for writing of data to the first and second wires. The control circuit precharges a non-selected second wire up to a standby voltage larger than a reference voltage prior to a set operation for programming only a variable resistor connected to selected first and second wires by supplying the reference voltage to a non-selected first wire and the selected second wire, applying a program voltage necessary for programming of the selected variable resistor based on the reference voltage to the selected first wire and applying a control voltage which prevents the rectifying device from turning ON based on the program voltage to the non-selected second wire.

20 Claims, 11 Drawing Sheets

FIG. 6
(a) Schottky structure
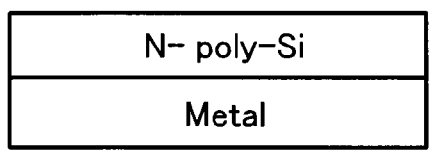
(d) MIM structure
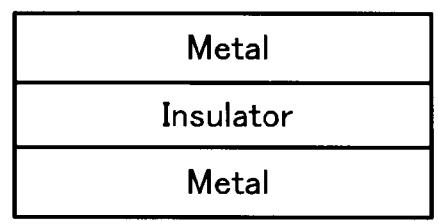
(b) PN structure
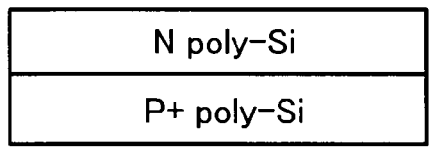
(e) SIS structure
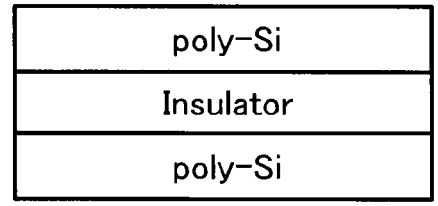
(c) PIN structure
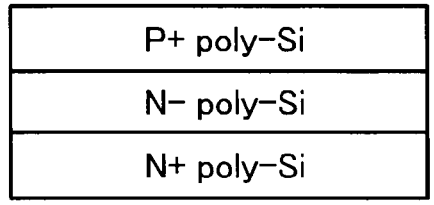

NONVOLATILE SEMICONDUCTOR STORAGE DEVICE AND DATA WRITING METHOD THEREFOR

CROSS-REFERENCE TO RELATED APPLICATIONS

This application is based upon and claims the benefit of priority from the prior Japanese Patent Application No. 2008-32646, filed on Feb. 14, 2008, the entire contents of which are incorporated herein by reference.

BACKGROUND OF THE INVENTION

1. Field of the Invention

The present invention relates to a nonvolatile semiconductor storage device which writes data in a nonvolatile manner by applying a voltage to a variable resistor and a data writing method therefor.

2. Description of the Related Art

Recently, a nonvolatile memory having memory cells each containing a variable resistor and disposed in array with connecting at intersections between word lines and bit lines has attracted attention.

A phase-change random access memory (PCRAM) having a chalcogenide device as the variable resistor, a resistance random access memory (ReRAM) having a transition metal oxide element, a memory having a cell which changes a resistance value by forming a contacting bridge between electrodes by depositing metallic cation or destroying the contacting bridge by ionizing the deposited metal (CBRAM) and the like are known as such the nonvolatile memory. These variable resistance memories are characterizes by storing information by utilizing a change of the resistance value.

In the PCRAM, the chalcogenide device are controlled a process from heating to cooling according to the shape of current/voltage pulse, i.e. magnitude and width, applied to the chalcogenide device to change the phase into the crystal state or non-crystal state, thereby the resistance value of the device can be controlled (see Japanese Patent Application National Publication No. 2002-541613). The ReRAM is classified into bi-polar type and uni-polar type. The bi-polar type memory controls the resistance value of the cell according to a polarity of a current/voltage pulse applied to the transition metal oxide element. On the other hand, the uni-polar type memory controls the resistance value of the cell according to the magnitude, width and the like of a current/voltage pulse applied to the transition metal oxide element.

In the case of the uni-polar type ReRAM, the variable resistance memory writes data by applying a program voltage (for example, approximately 4.5 V, the current value is approximately 10 nA) for 10 ns to 100 ns. As a result, the variable resistor is changed from a high resistance state to a low resistance state. This state change is called "program" or "set". If an erase voltage of approximately 0.7V is applied to the variable resistor in which data is programmed so as to feed a current of 1 µA to 10 µA for 200 ns to 1 µs, the variable resistor is changed from the low resistance state to the high resistance state. This state change is called "erase" or "reset".

In such a set operation or reset operation, a necessary program voltage or erase voltage is applied to the variable resistor only connected to a selected word line and bit line. On the other hand, non-selected word lines or bit lines needs to be loaded with a control voltage which acts as a reverse bias in order to prevent the diode from turning ON. However, the non-selected word lines or bit lines take much rise-up time because the number of the non-selected word lines or bit lines is larger than the number of the selected word lines or bit lines thus the total capacity of non-selected lines is larger than the selected lines. Therefore, if the non-selected word lines or the bit lines are turned ON/OFF at each data set timing, data write time increases.

SUMMARY OF THE INVENTION

According to an aspect of the present invention, there is provided a nonvolatile semiconductor storage device comprising: a first wire and a second wire intersecting each other; a memory cell which is disposed at each intersection of the first wire and the second wire and electrically rewritable and in which a variable resistor for memorizing a resistance value as data in a nonvolatile manner and a rectifying device are connected in series; and a control circuit which applies a voltage necessary for writing of data to the first and second wires, wherein the control circuit precharges a non-selected second wire up to a standby voltage larger than a reference voltage prior to a set operation for programming only a variable resistor connected to a selected first wire and a selected second wire by supplying the reference voltage to a non-selected first wire and the selected second wire, applying a program voltage necessary for programming of the selected variable resistor based on the reference voltage to the selected first wire and applying a control voltage which prevents the rectifying device from turning ON based on the program voltage to the non-selected second wire.

According to another aspect of the present invention, there is provided a nonvolatile semiconductor storage device comprising: a first wire and a second wire intersecting each other; a memory cell which is disposed at each intersection of the first wire and the second wire and electrically rewritable and in which a variable resistor for memorizing a resistance value as data in a nonvolatile manner and a rectifying device are connected in series; and a control circuit which applies a voltage necessary for writing of data to the first and second wires, wherein the control circuit executes the reset operation for erasing data of the variable resistor and precharges only the non-selected second wire up to a standby voltage during the reset operation, and the standby voltage is larger than a reference voltage provided to a non-selected first wire and a selected second wire at the time of the set operation.

According to still another aspect of the present invention, there is provided a data writing method for a nonvolatile semiconductor storage device which comprises a first wire and a second wire intersecting each other and a memory cell being disposed at each intersection of the first wire and the second wire and electrically rewritable and in which a variable resistor for memorizing a resistance value as data in a nonvolatile manner and a rectifying device are connected in series, and applies a voltage necessary for writing of data to the first wire and the second wire of the nonvolatile semiconductor storage device, the data writing method comprising: precharging a non-selected second wire up to a standby voltage larger than a reference voltage, prior to a set operation for programming only a variable resistor connected to a selected first wire and a selected second wire by supplying the reference voltage to a non-selected first wire and a selected second wire, applying a program voltage necessary for programming of the selected variable resistor based on the reference voltage to the selected first wire and applying a control voltage which prevents the rectifying device from turning ON based on the program voltage to the non-selected second wire.

BRIEF DESCRIPTION OF THE DRAWINGS

FIG. 6 is a schematic sectional view showing an example of a non-ohmic device according to the same embodiment;

DETAILED DESCRIPTION OF THE EMBODIMENTS

First Embodiment

Hereinafter, the first embodiment of the present invention will be described with reference to the accompanying drawings.

[Entire Structure]

Figure 1:
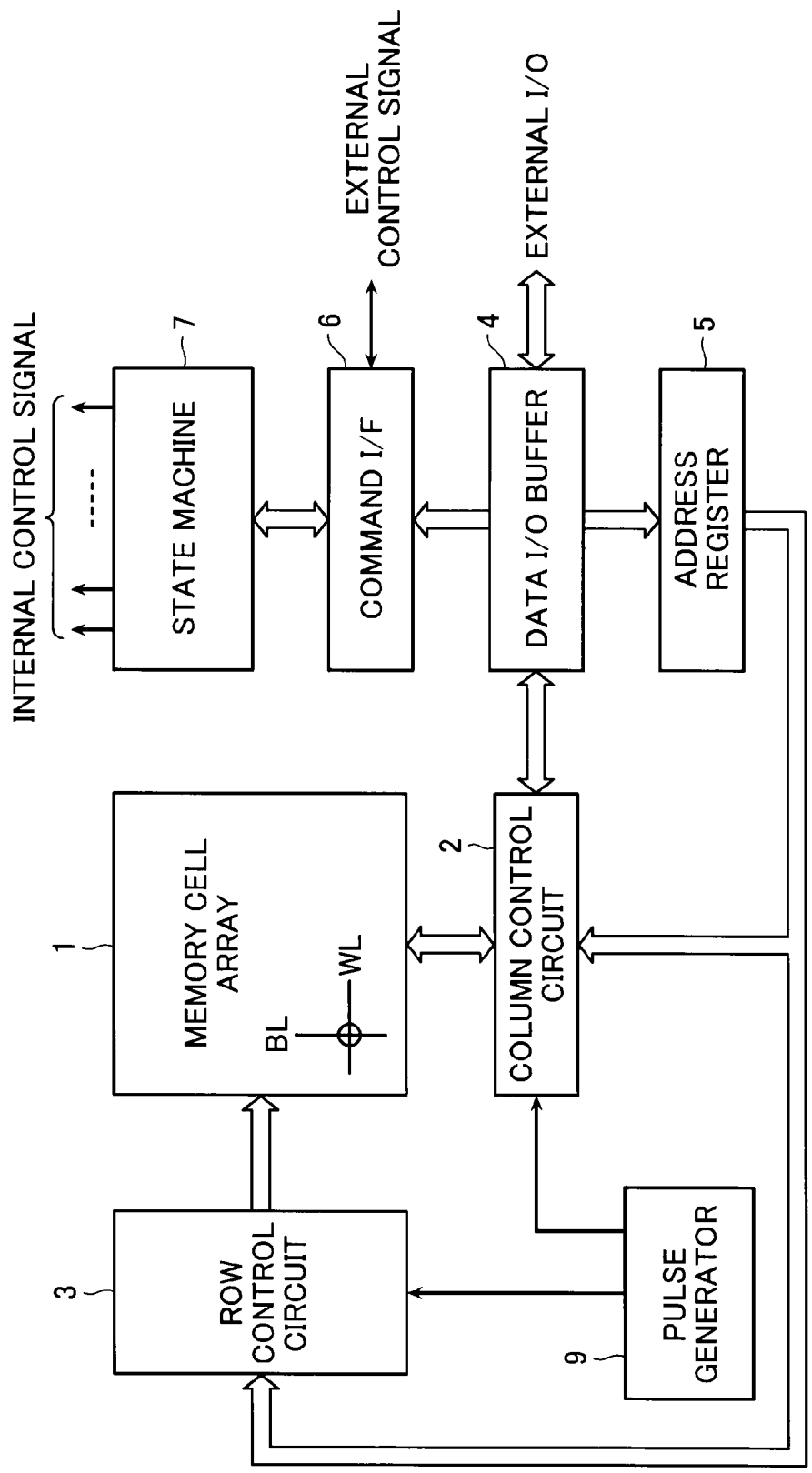
FIG. 1 is a block diagram of a nonvolatile semiconductor memory according to a first embodiment of the present invention.

FIG. 1 is a block diagram of the nonvolatile memory according to the first embodiment of the present invention.

The nonvolatile memory has a memory cell array 1 in which memory cells each composed of phase-change type device (PCRAM), resistance random access memory (ReRAM) or other resistance change type device are disposed in a matrix configuration. A column control circuit 2 for controlling bit lines BL of the memory cell array 1 and executing data erase of the memory cell, data write to the memory cell and data read from the memory cell is provided at a position adjacent to the memory cell array 1 in the bit line BL direction. A row control circuit 3 for selecting a word line WL of the memory cell array 1 and applying a voltage necessary for the data erase of the memory cell, data write to the memory cell and data read from the memory cell is provided at a position adjacent to the memory cell array 1 in a word line WL direction. The column control circuit 2 and the row control circuit 3 constitute a data read/write circuit for executing data read/write from/to the memory cell array 1.

A data I/O buffer 4 is connected to an external host device (not shown) so as to receive write data, receive an erase instruction, output read data and receive address data or command data from/to the host device. The data I/O buffer 4 sends received write data to the column control circuit 2, receives data read from the column control circuit 2 and outputs it to the outside. Address supplied from the external host device to the data I/O buffer 4 is sent to the column control circuit 2 and the row control circuit 3 through an address resistor 5. A command supplied from the external host device to the data I/O buffer 4 is sent to a command interface 6. The command interface 6 receives an external control signal from outside, determines whether the data input to the data I/O buffer 4 is write data, command or address and, if it is a command, receives and transfers the signal as a command signal to a state machine 7. The state machine 7 controls this entire nonvolatile memory, receives a command from an external host device and executes read, write, erase, data I/O control and the like. The external host device can receive status information controlled by the state machine 7 to determine the operation result thereof. This status information is also used for control of write and erase.

A pulse generator 9 is controlled by the state machine 7. By this control, the pulse generator 9 can output a pulse of any voltage at any timing. The pulse formed here can be transferred to any wire selected by the column control circuit 2 and the row control circuit 3.

Peripheral circuit devices other than the memory cell array 1 can be formed on a Si substrate just under the memory cell array 1 formed in a wiring layer and consequently, the chip area of this nonvolatile memory can be equalized with the area of the memory cell array 1.

[Memory Block and Peripheral Circuits Thereof]

Figure 2:
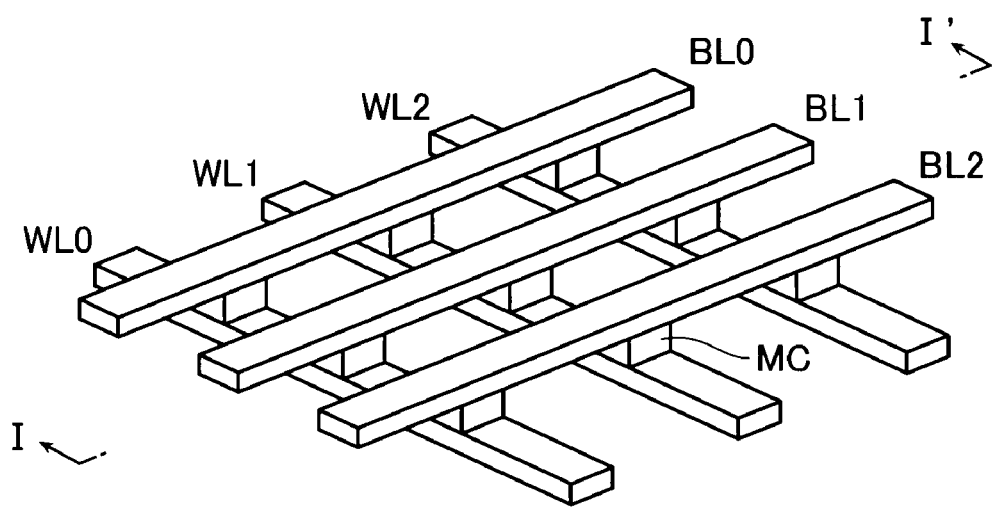
FIG. 2 is a perspective view of a part of the memory cell array of the nonvolatile memory according to the same embodiment.
Figure 3:
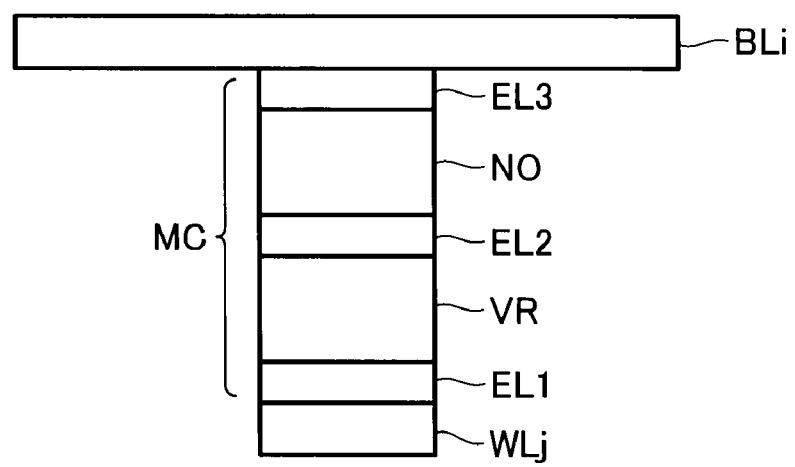
FIG. 3 is a sectional view of a single memory cell taken along the line I-I' in FIG. 2 as viewed in the direction of the arrow.

FIG. 2 is a perspective view of a part of the memory cell array 1 and FIG. 3 is a sectional view of a single memory cell taken along the line I-I' in FIG. 2 as viewed in the direction of the arrow.

As a plurality of first wires, word lines WL0 to WL2 are disposed in parallel and as a plurality of second wires, bit lines BL0 to BL2 are disposed in parallel such that they intersect the wordlines. A memory cell MC is disposed at each intersecting point such that it is sandwiched by the both wires. The first and second wires are preferred to be made of material resistant to heat and having a low resistance value and for example, W, WSi, NiSi, CoSi and the like may be used.

The memory cell MC includes a series connection circuit composed of a variable resistor VR and non-ohmic device NO.

The variable resistor VR can change a resistance value through a current, heat, chemical energy or the like by applying a voltage. Electrodes EL1, EL2 which function as barrier metal and adhesive layer are disposed on and under the variable resistor VR. As the electrode material, Pt, Au, Ag, TiAlN, SrRuO, Ru, RuN, Ir, Co, Ti, TiN, TaN, LaNiO, Al, PtIrOx, PtRhOx, Rh/TaAlN and the like may be used. A metal film which makes uniform orientation may also be inserted. A buffer layer, barrier metal layer, adhesive layer or the like may also be additionally inserted.

As the variable resistor VR, a material which changes its resistance value by phase transition between crystal state and amorphous state such as chalcogenide (PCRAM); a material which changes its resistance value by forming a contacting bridge between the electrodes by depositing metallic cations or by destroying the contacting bridge by ionizing the deposited metal (CBRAM); a material which changes its resistance value by applying a voltage or a current (ReRAM)(which is largely classified into a material which generates change in resistance due to presence/absence of charges trapped by a charge trap existing on an electrode interface and a material which generates change in resistance due to presence/absence of a conductive path originating from oxygen defect or the like); or the like may be used.

Figure 4:
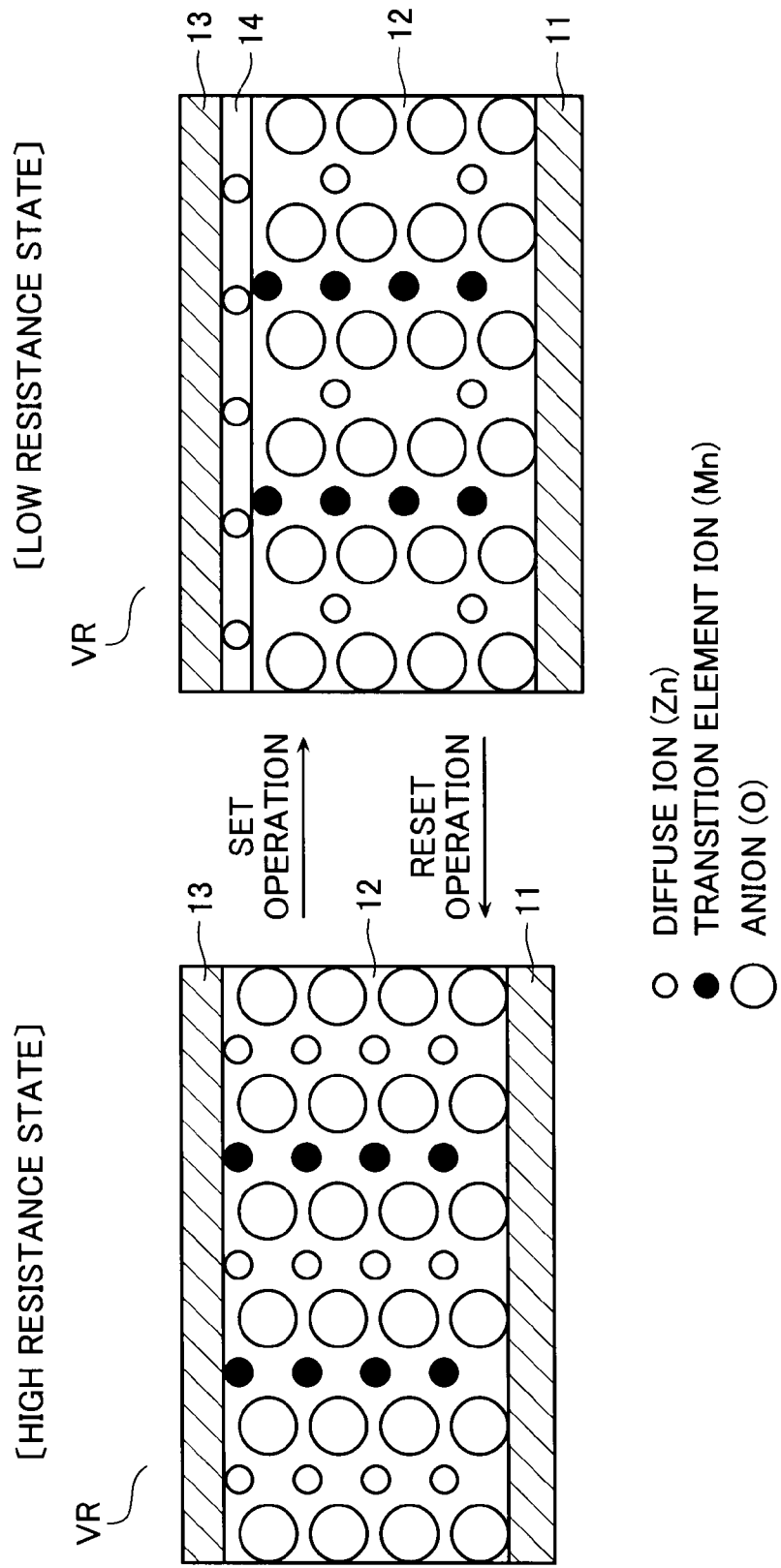
FIG. 4 is a schematic sectional view showing an example of a variable resistor according to the same embodiment.
Figure 5:
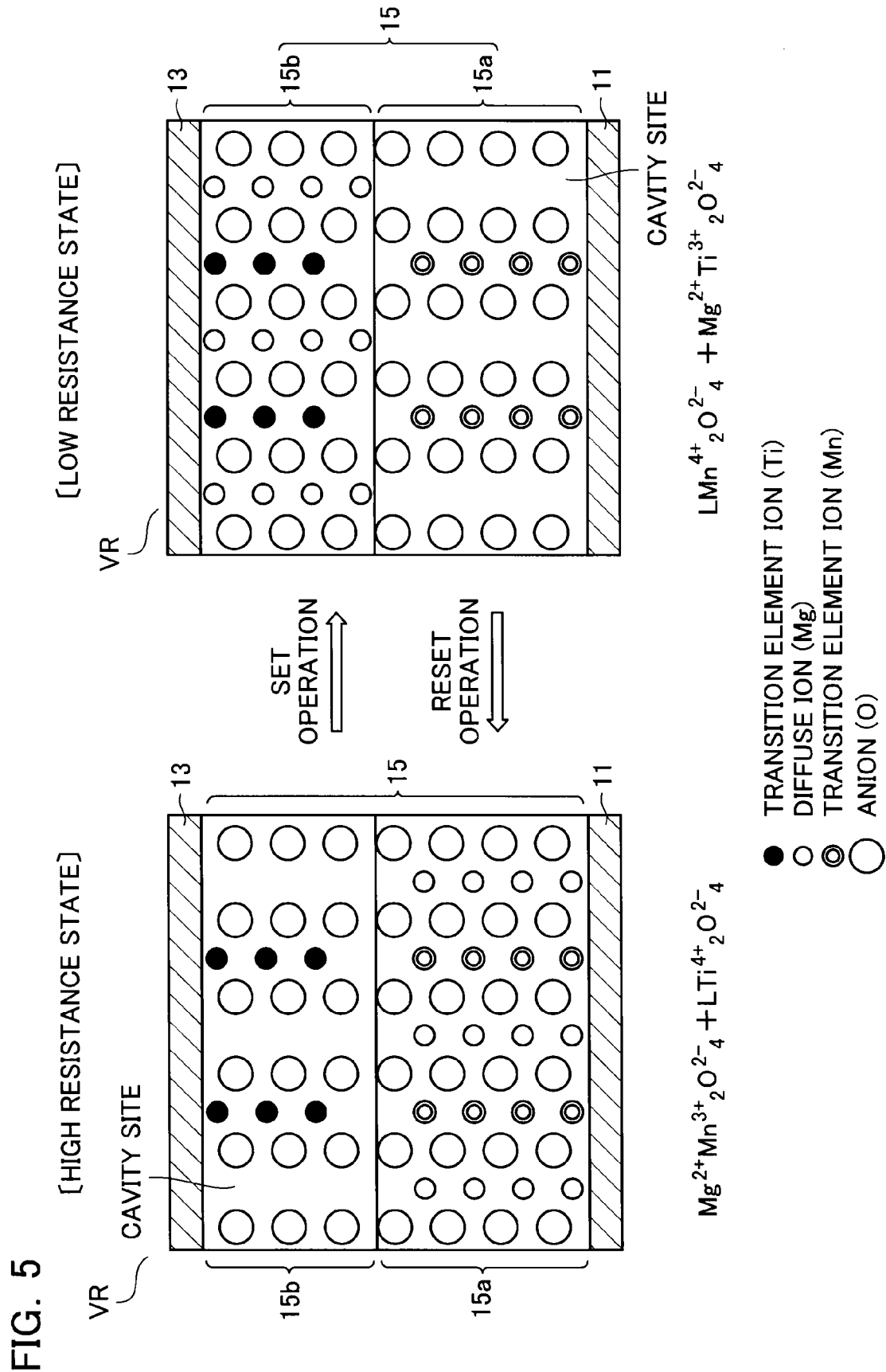
FIG. 5 is a schematic sectional view showing another example of the variable resistor according to the same embodiment.

FIGS. 4 and 5 show examples of the ReRAM. In the variable resistor VR shown in FIG. 4, a recording layer 12 is disposed between electrode layers 11 and 13. The recording layer 12 is constituted of composite compound having at least two kinds of cationic elements. At least one of the cationic elements is a transition element having a d-orbit incompletely filled with electrons, and a shortest distance between adjacent cationic elements is less than 0.32 nm. More specifically, the recording layer 12 is composed of a material expressed by a chemical formula AxMyXz (A and M are different elements from each other) having crystal structure such as spinel structure ($AM_2O_4$), ilmenite structure ($AMO_3$), delafossite structure ($AMO_2$), $LiMoN_2$ structure ($AMN_2$), wolframite structure ($AM_4$), olivine structure ($A_2MO_4$), hollandite structure ($AxMO_2$), ramsdellite structure ($AxMO_2$), perovskite structure ($AMO_3$) and the like.

In the example of FIG. 4, A is Zn, M is Mn and X is O. Within the recording layer 12, a small circle indicates diffuse ion (Zn), a large circle indicates anion (O) and a small black circle indicates transition element ion (Mn). The initial condition of the recording layer 12 is in a high resistance state and when a fixed potential is applied to the electrode layer 11 and a negative voltage is applied to the electrode layer 13 side, a part of diffuse ions in the recording layer 12 move to the electrode layer 13 side, and the diffuse ions in the recording layer 12 are reduced relative to anions. Because the diffuse ions moved to the electrode layer 13 side receive electrons from the electrode layer 13, they are deposited as metal so as to form a metal layer 14. Anions become excessive within the recording layer 12, thereby raising the lower layer of the transition element ions in the recording layer 12. Consequently, the recording layer 12 comes to have electronic conductivity by injection of carriers, thus completing the set operation. In reproduction, such a small value of current that material constituting the recording layer 12 undergoes no changes in resistance is fed. To reset a program state (low resistance state) to an initial state (high resistance state), for example, a large current is fed to the recording layer 12 in a sufficient time to perform Joule heating, enhancing oxidation-reduction reaction of the recording layer 12. The reset operation can also be performed by applying electric field opposite to that at set operation.

In the example of FIG. 5, a recording layer 15 sandwiched by the electrode layers 11, 13 is formed of two layers which are a first compound layer 15a and a second compound layer 15b. The first compound layer 15a is disposed on the side of the electrode layer 11 and expressed by a chemical formula AxM1yX1z. The second compound 15b is disposed on the side of the electrode layer 13 and has a cavity site which can accommodate cationic elements of the first compound layer 15a.

In the first compound layer 15a in the example of FIG. 5, A is Mg, M1 is Mn and X1 is O. The second compound layer 15b contains Ti indicated with a black circle as transition reduction ion. In the first compound layer 15a, a small circle indicates diffuse ion (Mg), a large circle indicates anion (O) and a double circle indicates transition element ion (Mn). The first compound layer 15a and the second compound layer 15b may be stacked into a plurality of layers of two or more.

If the electrode layers 11, 13 are supplied with potential so that the first compound layer 15a is on anode side and the second compound layer 15b is on cathode side in this variable resistor VR so as to generate a potential gradient in the recording layer 15, a part of the diffuse ions in the first compound layer 15a move within crystal into the second compound layer 15b on the cathode side. Because the gap site which can accommodate the diffuse ions exists in crystal of the second compound layer 15b, the diffuse ions moved from the first compound layer 15a are accommodated in this gap site. Consequently, the valence of the transition element ion in the first compound layer 15a rises while the valence of the transition element ion in the second compound layer 15b is reduced. Assuming that the first and second compound layers 15a, 15b are in high resistance state at the initial state, a part of the diffuse ions in the first compound layer 15a move into the second compound layer 15b, thus, conductive carriers are generated in crystal of the first and second compounds and both of them have electric conductivity. To reset the program state (low resistance state) to erase state (high resistance state), the recording layer 15 is supplied with a large current for a sufficient time to perform Joule heating to enhance oxidation-reduction reaction of the recording layer 15, similarly to the aforementioned example. The reset operation can also be performed by applying an electric field opposite to that at set operation.

The non-ohmic device NO is composed of various diodes such as (a) Schottky diode, (b) PN junction diode, (c) PIN diode, or (d) metal insulator metal (MIM) structure, (e) silicon insulator silicon (SIS) structure or the like as shown in FIG. 6. Electrodes EL2, EL3 for forming a barrier metal layer and adhesive layer may also be inserted here. When a diode is used, uni-polar operation can be carried out according to its characteristic while, in the case of MIN structure, SIS structure or the like, bi-polar operation can be carried out. The arrangement of the non-ohmic device NO and the variable resistor VR may be reversed in vertical positions with respect to FIG. 3 or the polarity of the non-ohmic device NO may be inverted vertically.

Figure 7:
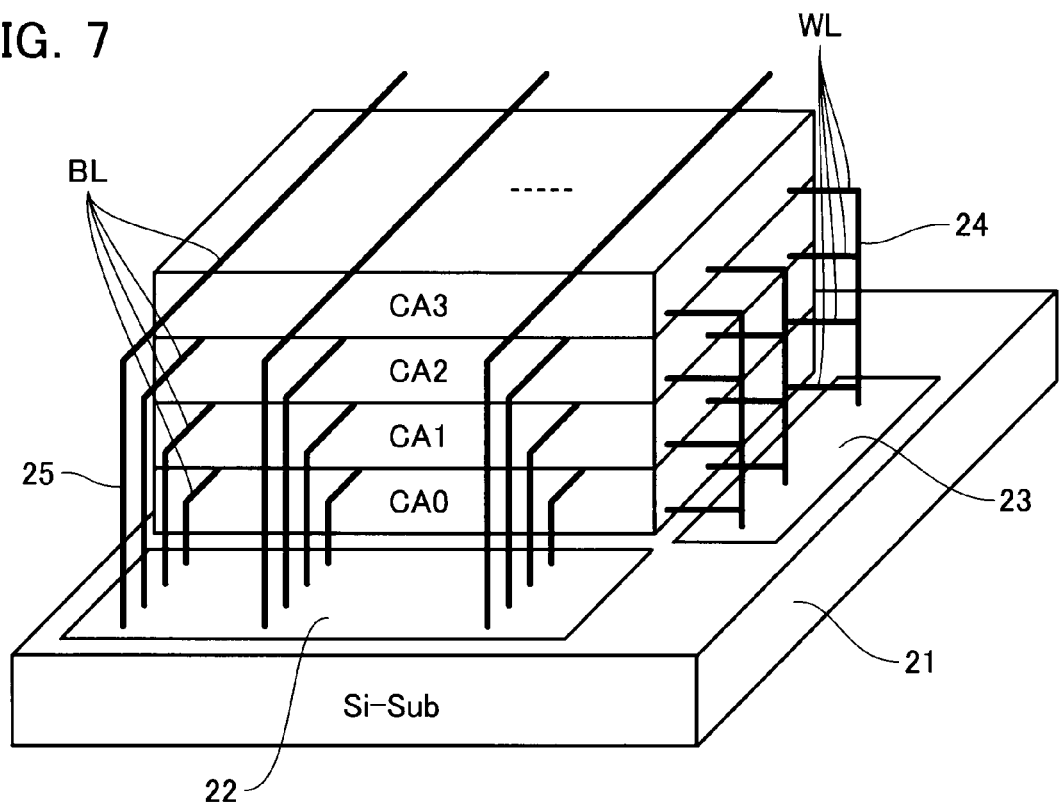
FIG. 7 is a perspective view showing an example of the memory cell array according to a modification of the same embodiment.

As shown in FIG. 7, the aforementioned memory structure may be of three dimensional structure in which a plurality of layers are stacked. FIG. 7 shows an example that four cell arrays CA0 to CA3 are stacked on a silicon substrate 21. Word lines WL of each cell array are connected to one another in common through a via wire 24 and to a row control circuit 23 on the substrate 21. Bit lines BL of the cell arrays CA0 to CA3 are independently connected to a column control circuit 22 on the substrate 21.

Figure 8:
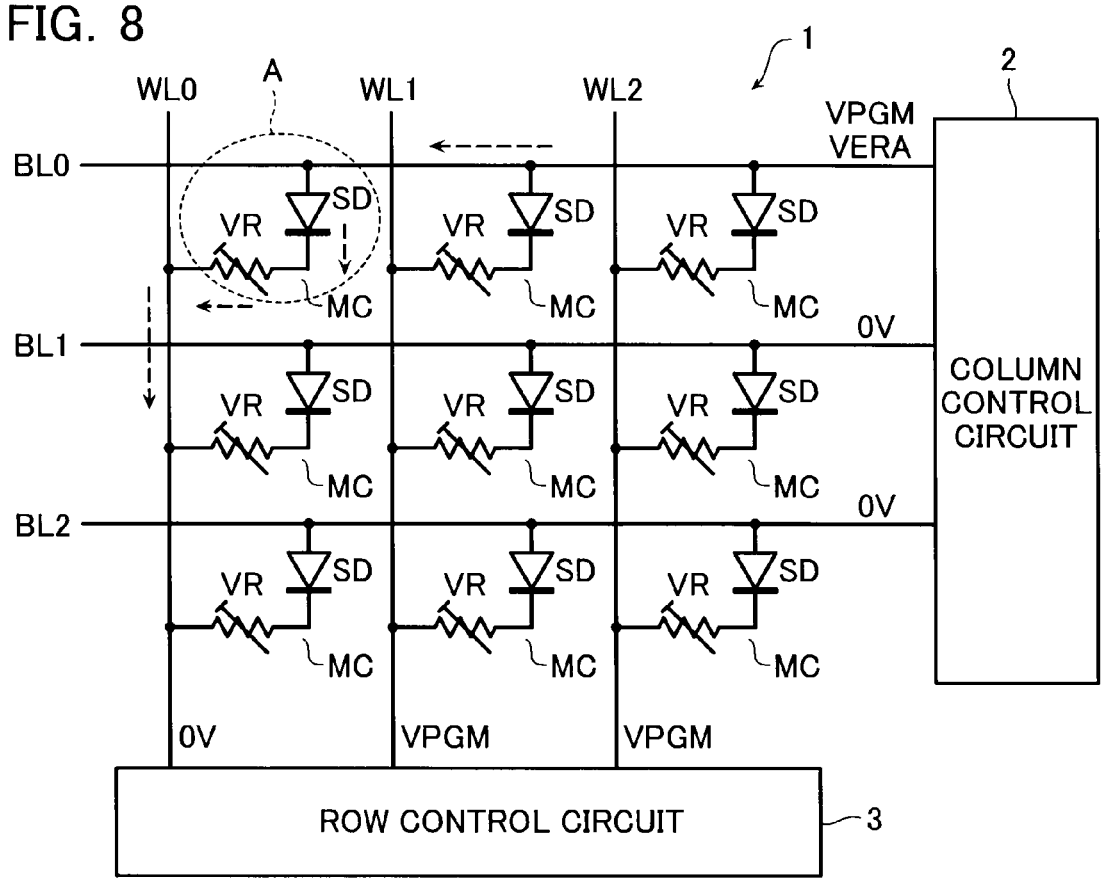
FIG. 8 is a circuit diagram of a memory cell array and peripheral circuits thereof of the nonvolatile memory according to the same embodiment.
Figure 9:
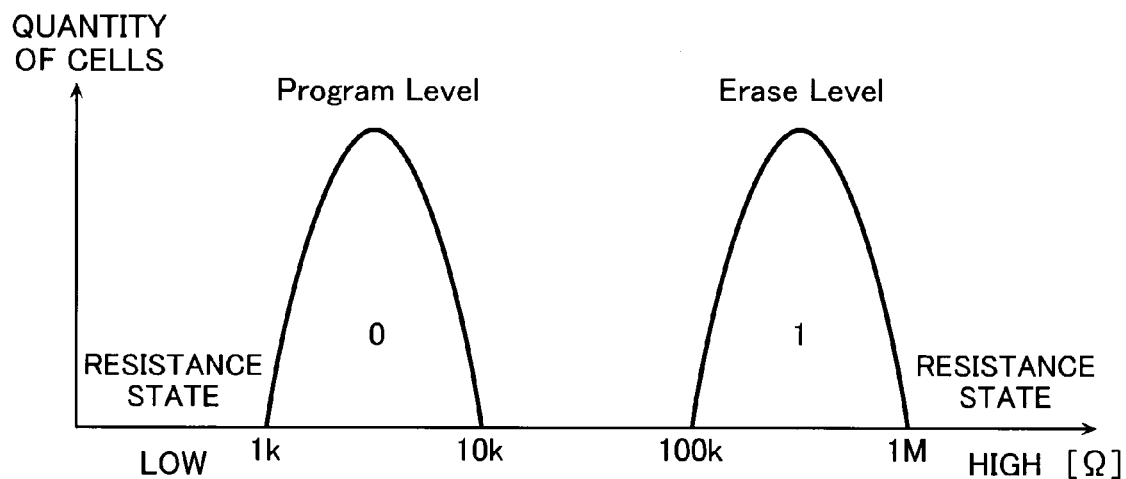
FIG. 9 is a graph showing the relationship between a resistance value distribution of the memory cell and data in the case of binary data.

FIG. 8 is an equivalent circuit diagram showing the memory cell array 1 of FIG. 1 in detail. In FIG. 8, a diode SD is used as the non-ohmic device NO, and it is assumed that this memory cell array is of a single layer structure in order to simplify the description.

Referring to FIG. 8, the memory cell MC of the memory cell array MA is constituted of a diode SD and variable resistor VR connected in series. The anode of the diode SD is connected to a bit line BL and the cathode is connected to a word line WL through the variable resistor VR. An end of each bit line BL is connected to the column control circuit 2, while an end of each word line WL is connected to the row control circuit 3.

The memory cell MC may be selected individually or may be of a type in which data of a plurality of memory cells MC leading to a selected word line WL1 is read out collectively. The memory cell array 1 may be so constructed that the polarity of the diode SD is reversed so that a current flows from the word line WL side to a bit line BL side.

[Operation of Nonvolatile Memory]

Next, an operation of the nonvolatile semiconductor memory having such a structure will be described.

The resistance values of the variable resistor VR which constitutes the memory cell MC are distributed in a high resistance range of 100 kΩ to 1 MΩ in an erase state and in a low resistance range of 1 kΩ to 10 kΩ in a write (program) state. Erase of data is carried out by reset operation of feeding a current of 1 µA to 10 µA for only 200 ns to 1 µs by applying an erase voltage VERA of, for example, about 0.7 V to the variable resistor VR. Data write (program) to the variable resistor VR is a procedure of shifting the resistance value of the variable resistor VR into the low resistance range by applying a program voltage VPGM of, for example, about 4.5 V (about 10 nA in terms of current value) for only 10 ns to 100 ns.

Assuming that a memory cell MC leading to a word line WL0 and a bit line BL0 is a selected cell A as indicated with a dotted circle in FIG. 8 to execute data write, write of "1" data is a reset operation and write of "0" data is a set operation. The reset operation and set operation are preferred to be executed at a different timing because they are carried out under different voltages and for different periods.

Figure 10:
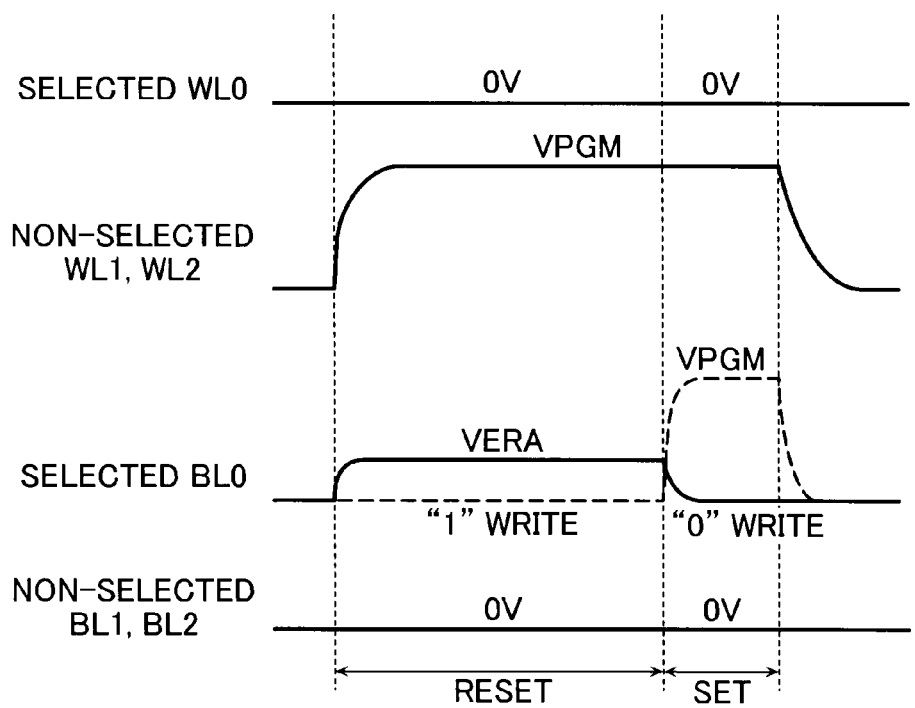
FIG. 10 is a waveform diagram for explaining a data writing method for the nonvolatile semiconductor memory according to the same embodiment.

FIG. 10 is a diagram showing an example that the reset operation precedes the set operation.

When "1" is written into the selected cell A, 0 V which is a reference voltage is applied to non-selected bit lines BL1, BL2 and the selected word line WL0 and an erase voltage VERA is applied to a selected bit line BL0. At this time, the erase voltage VERA is applied to the non-selected word lines WL1, WL2. However, according to the first embodiment, the non-selected word lines WL1, WL2 are charged with up to a program voltage VPGM which is a control voltage as a standby voltage even at the reset time in order to accelerate a rise-up at the set operation. As a result, the erase voltage VERA is applied to the selected cell A in forward bias for a predetermined time, so that an erase current flows and the selected cell A is reset by Joule heat generated internally. On the other hand, reverse bias is applied to the non-selected memory cell MC connected to the selected bit line BL0 and the non-selected word lines WL1, WL2, and no current flows. Further, 0 V is applied to both ends of the non-selected memory cell MC connected to the non-selected bit lines BL1, BL2 and the selected word line WL0 and thus, no current flows thereto either.

To write "0" into the selected cell A, 0 V which is a reference voltage is applied to the non-selected bit lines BL1, BL2 and the selected word line WL0 at the timing of the set operation following the reset operation and the program voltage VPGM is applied to the selected bit line BL0. At this time, the non-selected word lines WL1, WL2 are charged with up to the program voltage VPGM at the time of the reset operation. As a result, the program voltage VPGM is applied to the selected cell A so as to set the selected cell A. On the other hand, the program voltage VPGM is applied to both ends of the non-selected memory cell MC connected to the selected bit line BL0 and the non-selected word lines WL1, WL2 and no current flows. Further, 0 V is applied to both ends of the non-selected memory cell MC connected to the non-selected bit lines BL1, BL2 and the selected word line WL0 and no current flows in this case either.

To read data from the selected cell A, the read voltage VREAD is applied to the selected bit line BL0 while 0 V is applied to the non-selected bit lines BL1, BL2. A voltage of 0 V is applied to the selected word line WL0 while 0 V to VREAD is applied to the non-selected word lines WL1, WL2. Consequently, the diode of the selected cell A is biased in forward direction and thus, a current flowing to the selected cell A is detected by a sense amplifier (not shown) provided on the column control circuit 2 or the row control circuit 3 so as to determine whether a resistance value of the selected cell A is a high resistance or a low resistance. Consequently, the data read is carried out.

As described above, this embodiment has an effect that by securing a charge time for the non-selected word line during a preceding reset operation, the rise of the set operation can be accelerated. That is, because the reset operation takes several tens times as long as than the set operation and the voltages of the non-selected word lines WL1, WL2 do not need to be risen up to VPGM, a time taken for charging the non-selected word lines up to the program voltage VPGM can be concealed in the reset operating time by executing the reset operation and the charging operation for the non-selected word lines WL1, WL2 at the same time.

Further, according to this embodiment, power consumption can be reduced because the non-selected word lines are never charged or discharged in an interval between the reset operation and the set operation.

According to this embodiment, when raising the selected bit line BL0 up to the program voltage VPGM by the set operation, the selected bit line BL0 can be raised rapidly by only distribution of the capacity because a high voltage VPP output from the pulse generator 9 is connected to a large capacity Cap by the non-selected word lines. That is, the rise-up speed of the selected bit line BL0 does not depend on the pump capacity of the pulse generator 9.

Second Embodiment

Figure 11:
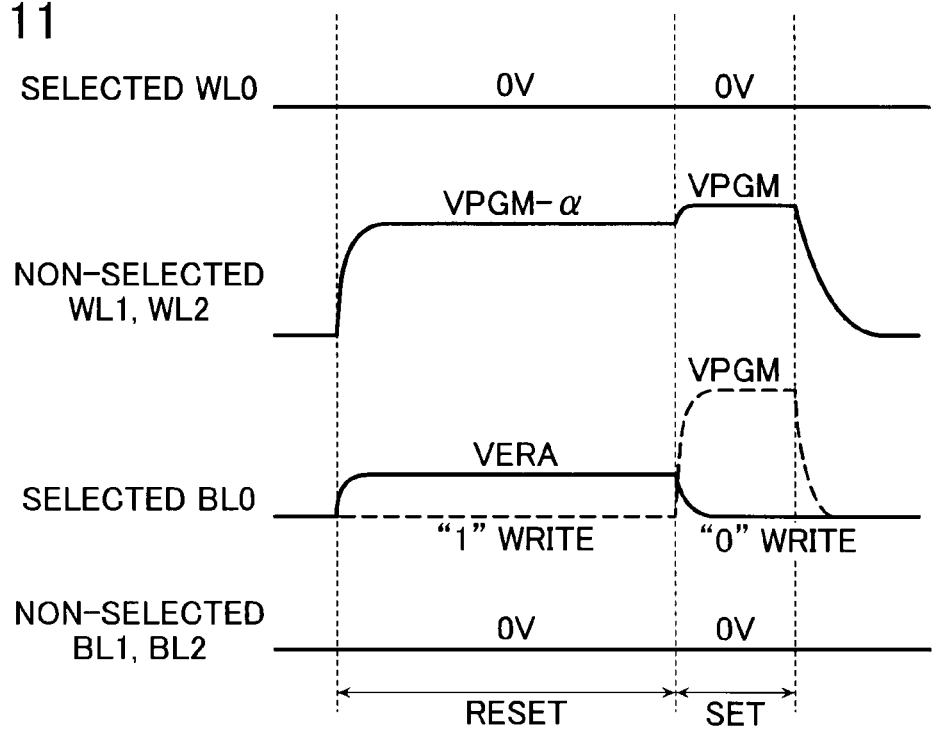
FIG. 11 is a waveform diagram for explaining a data writing method for the nonvolatile semiconductor memory according to a second embodiment of the present invention.

FIG. 11 is a waveform diagram for explaining a data writing method of the nonvolatile semiconductor memory according to the second embodiment of the present invention.

Although, in the first embodiment, the control voltage (program voltage) VPGM is applied to the non-selected word lines as a standby voltage at the time of the reset operation, in the second embodiment, VPGM-α, which is lower than the control voltage (program voltage), is applied to the non-selected word lines as the standby voltage at the time of the reset operation. Consequently, influences of off-leak current of the diode biased reversely can be excluded.

Third Embodiment

Figure 12:
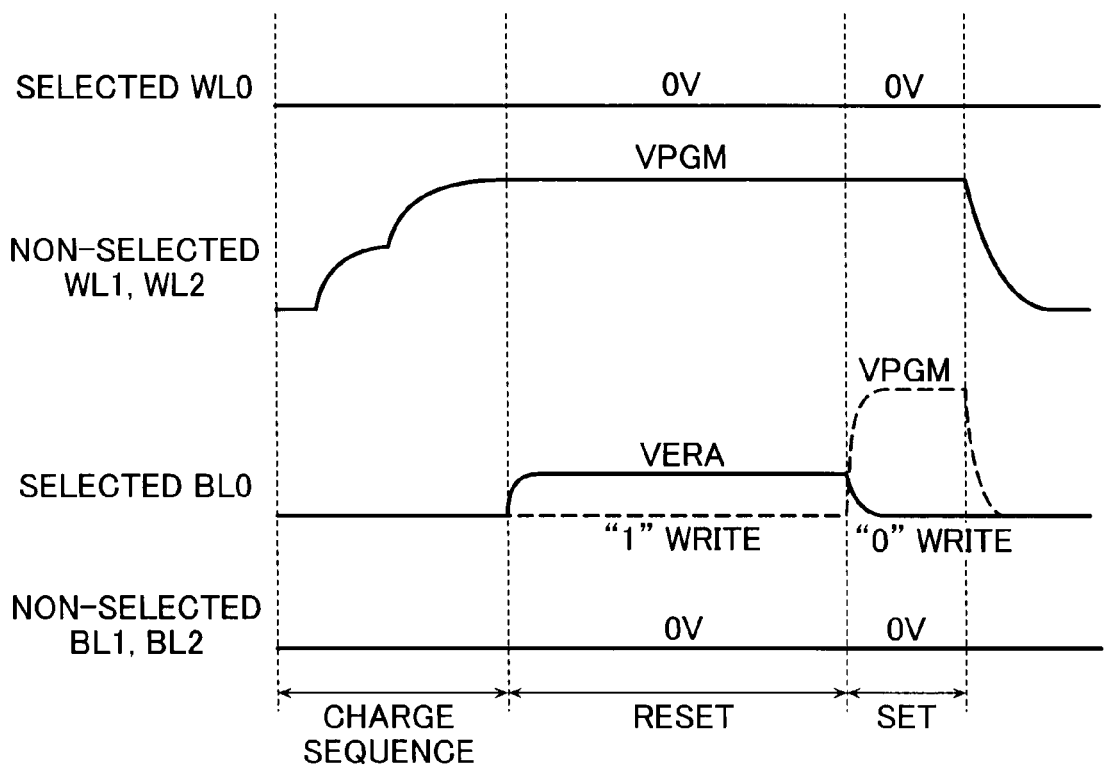
FIG. 12 is a waveform diagram for explaining a data writing method for the nonvolatile semiconductor memory according to a third embodiment of the present invention.

FIG. 12 is a waveform diagram for explaining a data writing method of the nonvolatile semiconductor memory according to the third embodiment of the present invention.

This third embodiment includes a charge sequence provided prior to the reset operation of the first embodiment.

According to this embodiment, the rise-up of the reset operation is accelerated. In addition, by charging the non-selected word lines with the VDD or other potential as the charge sequence before it is charged with the program voltage VPGM, as shown in the Figure, operation can be accelerated and a load on a boosting circuit can be reduced.

Fourth Embodiment

Figure 13:
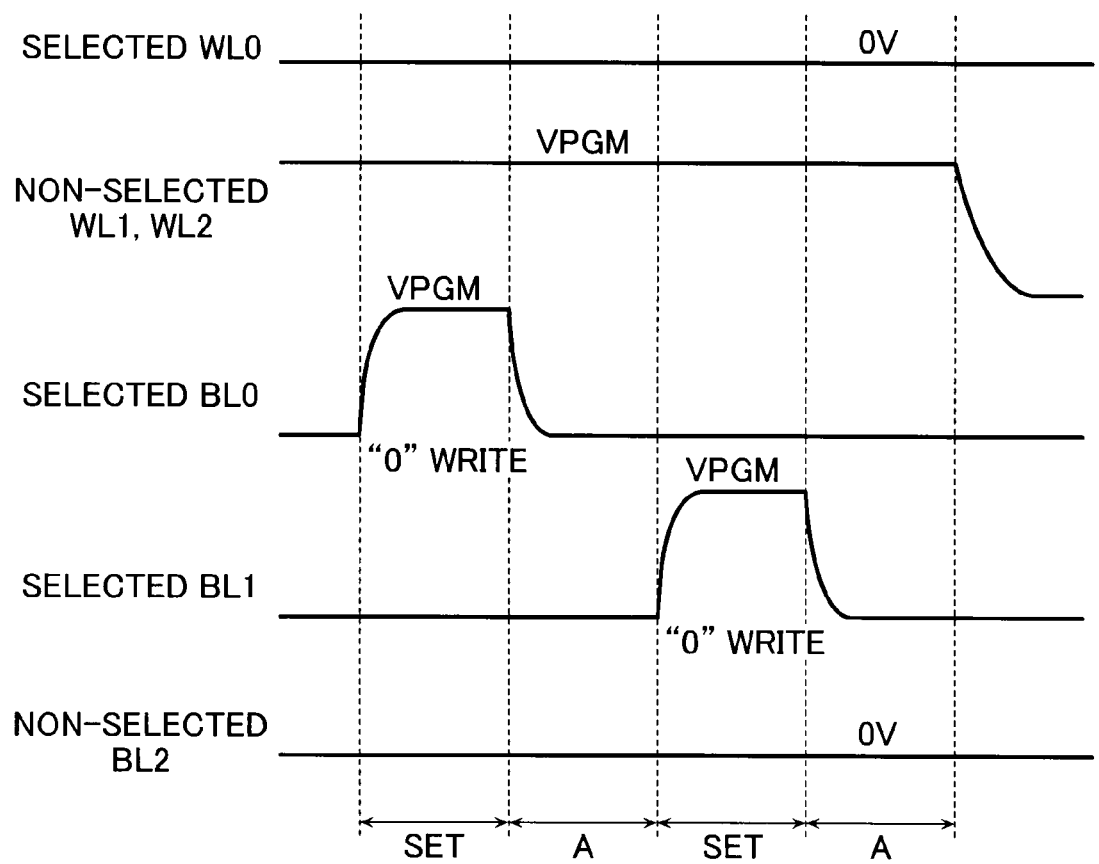
FIG. 13 is a waveform diagram for explaining a data writing method for the nonvolatile semiconductor memory according to a fourth embodiment of the present invention.

FIG. 13 is a waveform diagram for explaining a data writing method of the nonvolatile semiconductor memory according to the fourth embodiment of the present invention.

This embodiment shows an example of changing the selected bit lines successively to successively set the selected memory cells with the non-selected word lines maintained at the program voltage VPGM as the standby voltage. The setting may be successively carried out for each bit or for a predetermined division unit composed of a plurality of bits.

According to this embodiment, because the non-selected word lines are maintained at the program voltage VPGM, rapid data write is achieved by shortening the discharge and charge times for the non-selected word lines. Verify operation may be carried out during a switching time A of the selected bit line.

Fifth Embodiment

Figure 14:
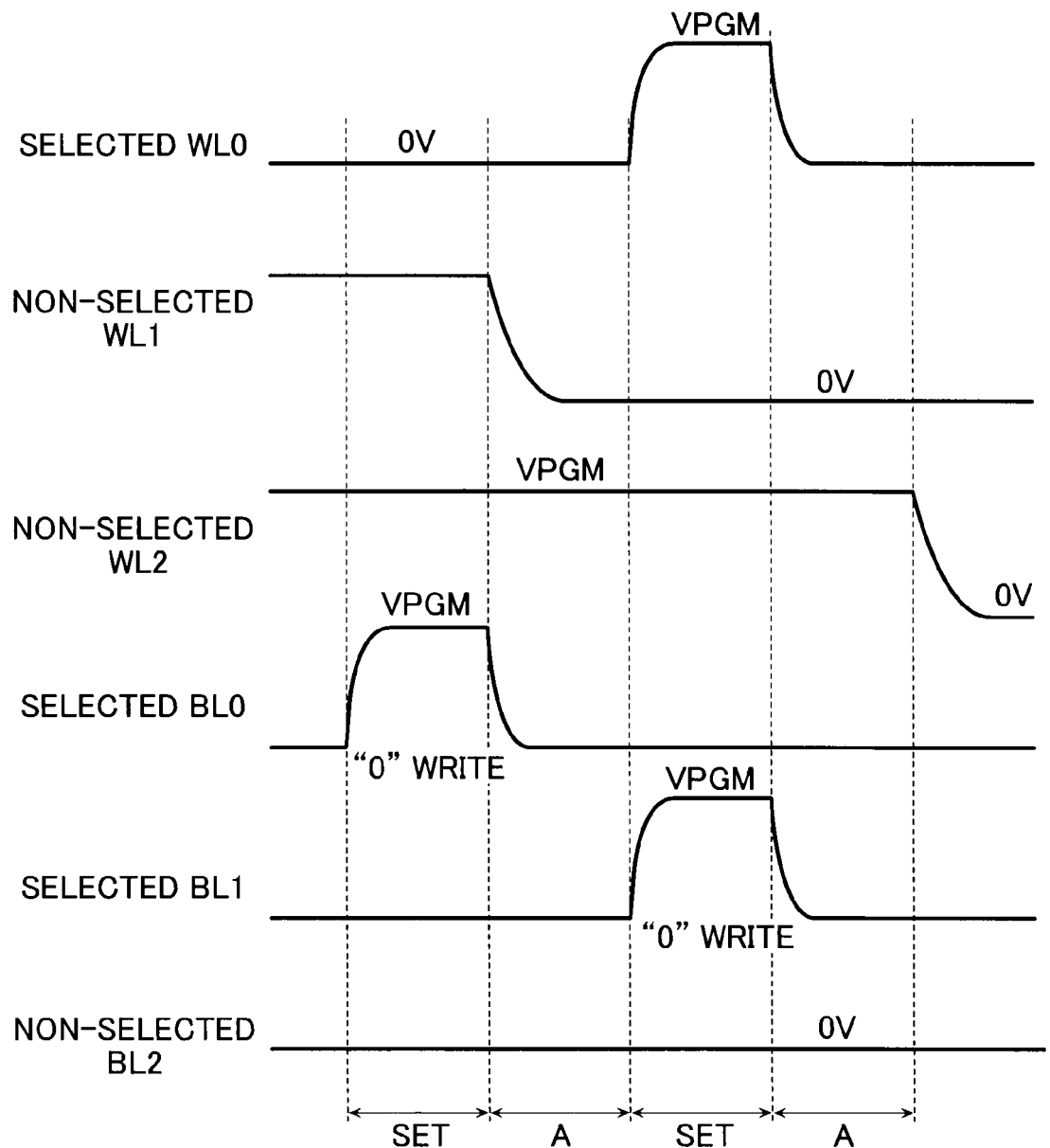
FIG. 14 is a waveform diagram for explaining a data writing method for the nonvolatile semiconductor memory according to a fifth embodiment of the present invention.

FIG. 14 is a waveform diagram for explaining the data write method of the nonvolatile semiconductor memory according to the fifth embodiment of the present invention.

This embodiment shows an example of changing the selected bit line and selected word line successively to successively set the selected memory cells. The setting may be carried out for each bit or for a predetermined division unit composed of a plurality of bits.

When the word lines BL0, BL1 are switched from a selected state to a non-selected state or from the non-selected state to the selected state, the word lines are charged or discharged. Because most of the non-selected word lines are maintained at the program voltage VPGM while the word lines to be charged or discharged are limited, the rapid data write is also achieved in this case.

Sixth Embodiment

Figure 15:
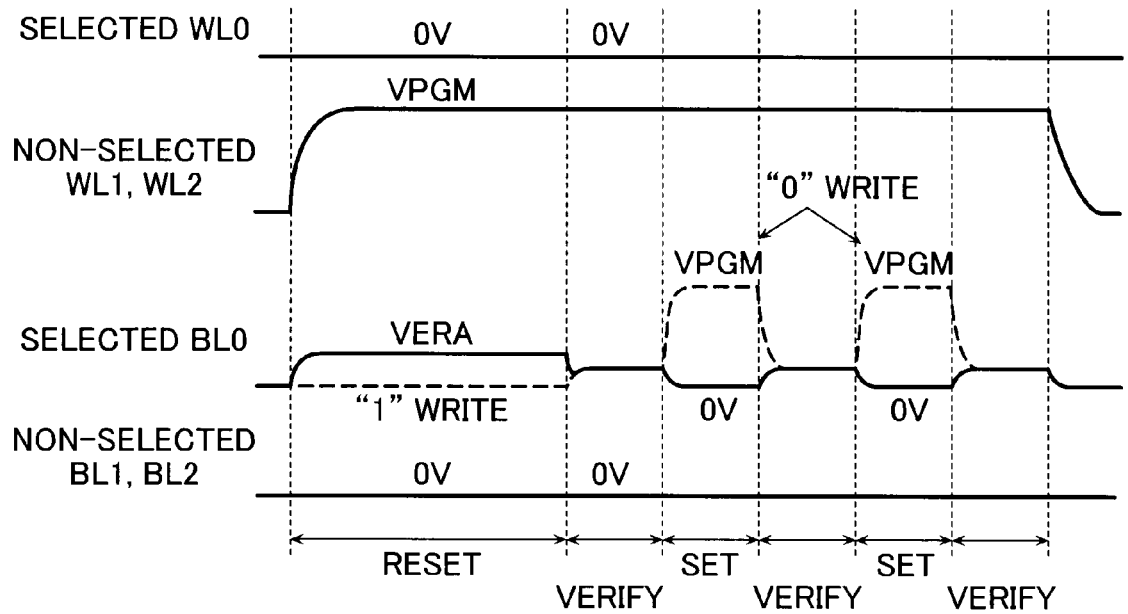
FIG. 15 is a waveform diagram for explaining a data writing method for the nonvolatile semiconductor memory according to a sixth embodiment of the present invention.

FIG. 15 is a waveform diagram for explaining a data write method of the non-volatile semiconductor memory according to the sixth embodiment of the present invention.

This embodiment includes verify operation following the reset operation and set operation. The non-selected word lines maintain the program voltage VPGM as the standby voltage also during the verify operation. Consequently, the rapid data write is achieved as in the above-described embodiments.

Seventh Embodiment

Figure 16:
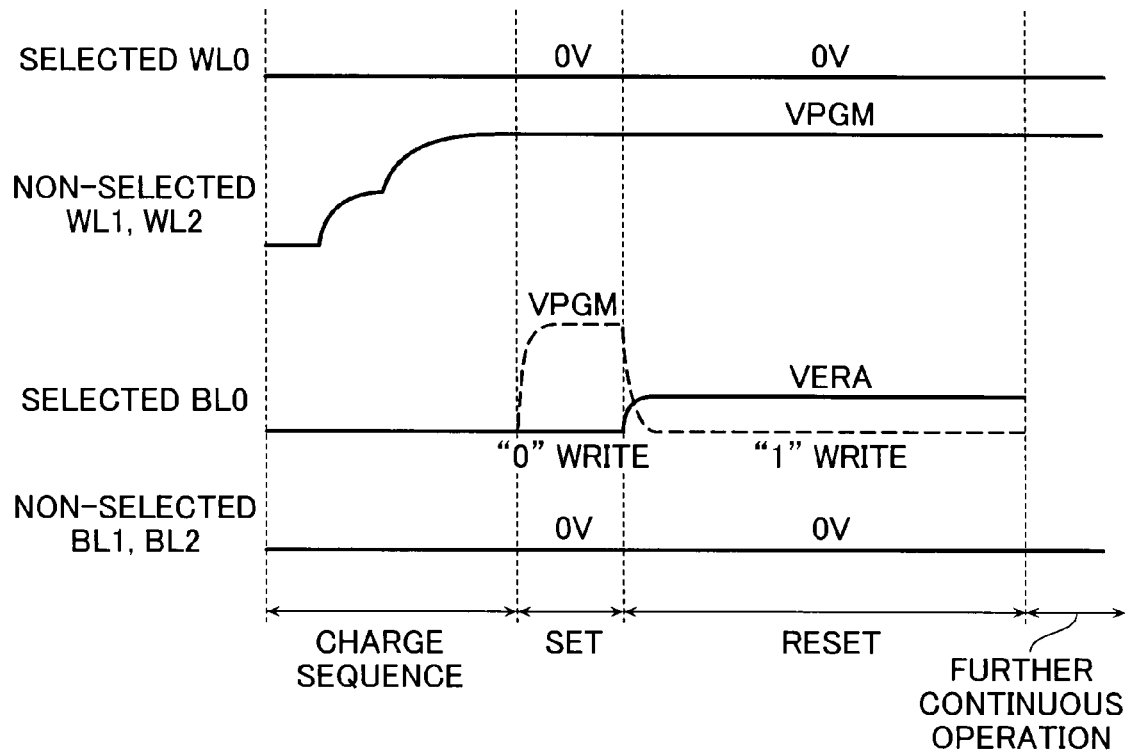
FIG. 16 is a waveform diagram for explaining a data writing method for the nonvolatile semiconductor memory according to a seventh embodiment of the present invention.

FIG. 16 is a waveform diagram for explaining the data write method of the nonvolatile semiconductor memory according to the seventh embodiment of the present invention.

This embodiment shows an example in which the set operation is provided prior to the reset operation. The charge sequence is provided prior to the set operation. In this embodiment, the non-selected word lines are charged with up to the program voltage VPGM during the charge sequence so as to execute writing of "0" (set) first. The voltage of the non-selected word lines is maintained at the program voltage VPGM also during the reset operation. Hereinafter, further continuous operations may be carried out.

Consequently, ON/OFF of the non-selected word lines can be omitted, thereby achieving rapid write and reduction of power consumption.

Other Embodiments

The present invention is not limited to the above-described embodiments.

Although, in the above embodiments, the bit line is referred to as the first wire and the word line is referred to as the second wire, the same data writing method can be achieved with the word line as the first wire and the bit line as the second wire if the polarity of a rectifying device of the memory cell is inverted.

The control voltage which blocks the rectifying device to turn ON is not limited to the program voltage but a lower voltage may be employed within a range which does not exceed the threshold of the rectifying device.

What is claimed is:

1. A nonvolatile semiconductor storage device comprising:
a first wire and a second wire intersecting each other;
a memory cell which is disposed at each intersection of the first wire and the second wire and electrically rewritable and in which a variable resistor for memorizing a resistance value as data in a nonvolatile manner and a rectifying device are connected in series; and
a control circuit which applies a voltage necessary for writing of data to the first and second wires, wherein
the control circuit precharges a non-selected second wire up to a standby voltage larger than a reference voltage prior to a set operation for programming only a variable resistor connected to a selected first wire and a selected second wire by supplying the reference voltage to a non-selected first wire and the selected second wire, applying a program voltage necessary for programming of the selected variable resistor based on the reference voltage to the selected first wire and applying a control voltage which prevents the rectifying device from turning ON based on the program voltage to the non-selected second wire.

2. The nonvolatile semiconductor storage device according to claim 1, wherein the control circuit executes a reset operation for erasing data in the variable resistor at a timing preceding the set operation to the variable resistor and precharges only the non-selected second wire up to the standby voltage during the reset operation.

3. The nonvolatile semiconductor storage device according to claim 2, wherein the standby voltage is equal to the control voltage or less.

4. The nonvolatile semiconductor storage device according to claim 1, wherein the control circuit executes a reset operation to the variable resistor at a timing preceding the set operation to the variable resistor, provides a charge sequence operation period for precharging only the non-selected second wire up to the standby voltage at a timing preceding the reset operation, and maintains the non-selected second wire at the standby voltage during the reset operation.

5. The nonvolatile semiconductor storage device according to claim 1, wherein the control circuit switches the variable resistors to be programmed successively while maintaining the non-selected second wire at the standby voltage.

6. The nonvolatile semiconductor storage device according to claim 1, wherein the control circuit precharges only the non-selected second wire up to the standby voltage prior to a verify operation to the variable resistor which is executed at a timing preceding the set operation to the variable resistor and maintains the non-selected second wire at the standby voltage during the verify operation.

7. The nonvolatile semiconductor storage device according to claim 4, wherein the control circuit charges the non-selected second wire up to a predetermined voltage being equal to the standby voltage or less during the charge sequence operation period before precharging the non-selected second wire up to the standby voltage.

8. The nonvolatile semiconductor storage device according to claim 1, wherein the variable resistor generates changes in resistance according to presence or absence of a charge trapped by a charge trap existing on an electrode interface, or presence or absence of a conductive path occurred by oxygen defect.

9. The nonvolatile semiconductor storage device according to claim 1, wherein the rectifying device is constituted of any one of Schottky diode, PN junction diode, PIN diode, MIM structure and SIS structure.

10. A nonvolatile semiconductor storage device comprising:
a first wire and a second wire intersecting each other;
a memory cell which is disposed at each intersection of the first wire and the second wire and electrically rewritable and in which a variable resistor for memorizing a resistance value as data in a nonvolatile manner and a rectifying device are connected in series; and
a control circuit which applies a voltage necessary for writing of data to the first and second wires, wherein
the control circuit executes the reset operation for erasing data of the variable resistor and precharges only the non-selected second wire up to a standby voltage during the reset operation, and
the standby voltage is larger than a reference voltage provided to a non-selected first wire and a selected second wire at the time of the set operation.

11. The nonvolatile semiconductor storage device according to claim 10, wherein the variable resistor generates changes in resistance according to presence or absence of a charge trapped by a charge trap existing on an electrode interface or presence, or absence of a conductive path occurred by oxygen defect.

12. The nonvolatile semiconductor storage device according to claim 10, wherein the rectifying device is constituted of any one of Schottky diode, PN junction diode, PIN diode, MIM structure and SIS structure.

13. A data writing method for a nonvolatile semiconductor storage device which comprises a first wire and a second wire intersecting each other and a memory cell being disposed at each intersection of the first wire and the second wire and electrically rewritable and in which a variable resistor for memorizing a resistance value as data in a nonvolatile manner and a rectifying device are connected in series, and applies a voltage necessary for writing of data to the first wire and the second wire of the nonvolatile semiconductor storage device, the data writing method comprising:
precharging a non-selected second wire up to a standby voltage larger than a reference voltage, prior to a set operation for programming only a variable resistor connected to a selected first wire and a selected second wire by supplying the reference voltage to a non-selected first wire and the selected second wire, applying a program voltage necessary for programming of the selected variable resistor based on the reference voltage to the selected first wire and applying a control voltage which prevents the rectifying device from turning ON based on the program voltage to the non-selected second wire.

14. The data writing method for the nonvolatile semiconductor storage device according to claim 13, further comprising: executing a reset operation for erasing data in the variable resistor at a timing preceding the set operation to the variable resistor and precharging only the non-selected second wire up to the standby voltage during the reset operation.

15. The data writing method for the nonvolatile semiconductor storage device according to claim 14, wherein the standby voltage is equal to the control voltage or less.

16. The data writing method for the nonvolatile semiconductor storage device according to claim 13, further comprising: executing a reset operation to the variable resistor at a timing preceding the set operation to the variable resistor; providing a charge sequence operation period for precharging only the non-selected second wire up to the standby voltage at a timing preceding the reset operation; and maintaining the non-selected second wire at the standby voltage during the reset operation.

17. The data writing method for the nonvolatile semiconductor storage device according to claim 13, further comprising: switching the variable resistors to be programmed successively while maintaining the non-selected second wire at the standby voltage.

18. The data writing method for the nonvolatile semiconductor storage device according to claim 13, further comprising: precharing only the non-selected second wire up to the standby voltage prior to a verify operation to the variable resistor which is executed at a timing preceding the set operation to the variable resistor; and maintaining the non-selected second wire at the standby voltage during the verify operation.

19. The data writing method for the nonvolatile semiconductor storage device according to claim 15, further comprising: charging the non-selected second wire up to a predetermined voltage being equal to the standby voltage or less during the charge sequence operation period before precharging the non-selected second wire up to the standby voltage.

20. The data writing method for the nonvolatile semiconductor storage device according to claim 13, wherein the variable resistor generates changes in resistance according to presence or absence of a charge trapped by a charge trap existing on an electrode interface, or presence or absence of a conductive path occurred by oxygen defect.

* * * * *